(12) United States Patent
Banerjee et al.

(10) Patent No.: US 11,776,639 B2
(45) Date of Patent: Oct. 3, 2023

(54) MODIFIED DISTRIBUTION OF MEMORY DEVICE STATES

(71) Applicant: Western Digital Technologies, Inc., San Jose, CA (US)

(72) Inventors: Amiya Banerjee, Bangalore (IN); Vinayak Bhat, Bangalore (IN); Harish R. Singidi, Fremont, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 15 days.

(21) Appl. No.: 17/959,029

(22) Filed: Oct. 3, 2022

(65) Prior Publication Data

US 2023/0021663 A1  Jan. 26, 2023

Related U.S. Application Data

(63) Continuation of application No. 17/319,756, filed on May 13, 2021, now Pat. No. 11,462,279.

(51) Int. Cl.
*G11C 16/34* (2006.01)
*G11C 16/26* (2006.01)
*G11C 16/10* (2006.01)

(52) U.S. Cl.
CPC ......... *G11C 16/3418* (2013.01); *G11C 16/102* (2013.01); *G11C 16/26* (2013.01); *G11C 16/3404* (2013.01)

(58) Field of Classification Search
CPC .... G11C 16/3418; G11C 16/102; G11C 16/26; G11C 16/3404; G11C 2029/0411; G11C 16/3495; G11C 11/5628; G11C 7/1006; G11C 16/3427; G11C 16/0483
USPC .................................................. 365/185.02
See application file for complete search history.

(56) References Cited

U.S. PATENT DOCUMENTS 8,301,912 B2 * 10/2012 Lin et al. ........... G11B 20/0021
                                                    713/193
10,720,217 B1    7/2020 Tran et al.
10,734,087 B2    8/2020 Cohen et al.
11,355,216 B1 *  6/2022 Wu .................. G11C 29/12005
(Continued)

FOREIGN PATENT DOCUMENTS

CN    102148058 A  *  8/2011 .............G11C 11/5642
CN    111199768 A  *  5/2020 .............G06F 11/1012
(Continued)

OTHER PUBLICATIONS

Lee, D. et al., "Decision Directed Estimation of Threshold Voltage Distribution in Nand Flash Memory", IEEE Transactions on Signal Processing, Vol. 62, No. 4, Feb. 15, 2014.

*Primary Examiner* — Fernando Hidalgo
(74) *Attorney, Agent, or Firm* — Ravi Mohan; Rutan & Tucker, LLP

(57) ABSTRACT

Storage devices include a memory array comprised of a plurality of memory devices. These memory devices are programmed with a modified distribution across the available memory states within the devices. The modified distribution of memory states attempts to minimize the use of memory states that are susceptible to negative effects. These negative effects can include read and write disturbs as well as data retention errors. Often, these negative effects occur on memory states on the lower and upper states within the voltage threshold range of the memory device. The distribution of memory states can be modified though the use of a modified randomization seed configured to change the probabilities of programming of each page within the memory device. This modification of the randomization seed can yield desired distribution of memory device states that are configured to reduce exposure to negative effects thus prolonging the overall lifespan of the storage device.

20 Claims, 10 Drawing Sheets

(56) References Cited

U.S. PATENT DOCUMENTS

| | | | |
|---|---|---|---|
| 2014/0365172 A1 | 12/2014 | Liao et al. | |
| 2016/0147582 A1* | 5/2016 | Karakulak et al. | ... G06F 11/079 714/37 |
| 2020/0133832 A1 | 4/2020 | Xu et al. | |
| 2022/0229594 A1* | 7/2022 | Na ................. | G06F 3/0673 |

FOREIGN PATENT DOCUMENTS

CN 111951871 A * 11/2020 .............. G06F 11/1012

* cited by examiner

|   |   | QLC States |   |   |   |   |   |   |   |   |   |   |   |   |   |   |   | Random |   | Modified |   | Total Device |
|---|---|---|---|---|---|---|---|---|---|---|---|---|---|---|---|---|---|---|---|---|---|---|
|   |   | Er | S1 | S2 | S3 | S4 | S5 | S6 | S7 | S8 | S9 | S10 | S11 | S12 | S13 | S14 | S15 | P(0) | P(1) | P(0) | P(1) | |
| Pages | LP | 1 | 1 | 1 | 1 | 0 | 0 | 1 | 1 | 1 | 1 | 1 | 0 | 0 | 0 | 0 | 0 | 0.5 | 0.5 | 0.4 | 0.6 | 16000 |
|   | MP | 1 | 1 | 0 | 0 | 0 | 0 | 0 | 1 | 1 | 0 | 0 | 0 | 1 | 1 | 1 | 1 | 0.5 | 0.5 | 0.7 | 0.3 | |
|   | UP | 1 | 1 | 1 | 1 | 1 | 0 | 0 | 0 | 0 | 0 | 0 | 1 | 1 | 0 | 0 | 1 | 0.5 | 0.5 | 0.9 | 0.1 | |
|   | TP | 1 | 0 | 0 | 1 | 1 | 1 | 1 | 1 | 0 | 0 | 0 | 0 | 0 | 0 | 1 | 1 | 0.5 | 0.5 | 0.7 | 0.3 | |
| P (state) | Random dist. | 0.0625 | 0.0625 | 0.0625 | 0.0625 | 0.0625 | 0.0625 | 0.0625 | 0.0625 | 0.0625 | 0.0625 | 0.0625 | 0.0625 | 0.0625 | 0.0625 | 0.0625 | 0.0625 | | | | | |
|   | Mod. | 0.0054 | 0.0126 | 0.0294 | 0.0126 | 0.0084 | 0.0756 | 0.1134 | 0.0486 | 0.1134 | 0.2646 | 0.1764 | 0.0196 | 0.0084 | 0.0756 | 0.0324 | 0.0036 | | | | | |
| Device pop. | Random dist. | 1000 | 1000 | 1000 | 1000 | 1000 | 1000 | 1000 | 1000 | 1000 | 1000 | 1000 | 1000 | 1000 | 1000 | 1000 | 1000 | | | | | |
|   | Mod. | 86.4 | 201.6 | 470.4 | 201.6 | 134.4 | 1209.6 | 1814.4 | 777.6 | 1814.4 | 4233.6 | 2822.4 | 313.6 | 134.4 | 1209.6 | 518.4 | 57.6 | | | | | |

Small Device population — Large Device population — Small Device population

FIG. 7

MODIFIED DISTRIBUTION OF MEMORY DEVICE STATES

PRIORITY

This application claims the benefit of and priority to U.S. Pat. Application No. 17/319,756 filed on May 13, 2021, which is incorporated in its entirety herein.

FIELD

The present disclosure relates to storage systems. More particularly, the present disclosure relates to modifying the distribution of memory device states to reduce read errors and other negative spatial effects in storage devices.

BACKGROUND

Storage devices are ubiquitous within computing systems, and solid-state storage devices have become a quite common choice. These nonvolatile storage devices can communicate and utilize various protocols including non-volatile memory express (NVMe), and peripheral component interconnect express (PCIe) to reduce processing overhead and increase efficiency. These solid-state storage devices typically contain a memory array comprised of a large number of memory devices that store a range of electrical charges that can be associated with particular values.

As solid-state storage device technology evolves, the number of values that can be stored as recognizable values within the memory devices increases. These additional values can occur by creating more discrete subranges of electrical charge stored each memory device. As the number of values stored within each memory device increases, the precision required to write and read those values also needs to increase. Additionally, the memory devices themselves are positioned closer and closer with one another.

These phenomena can increase the memory devices' susceptibility to various negative effects. In certain scenarios, memory devices can have their programmed electrical charge disturbed (i.e., changed) from a previously stored value. This can occur when a neighboring memory device write (i.e., program) or read data. For other memory devices that have been programmed with a value toward the higher end of the range of stored electrical charge, the ability to retain the data is also decreased. These negative effects can affect at least twenty-five percent of available data values within various memory devices, lowering the overall useful lifespan of the storage device.

BRIEF DESCRIPTION OF DRAWINGS

The above, and other, aspects, features, and advantages of several embodiments of the present disclosure will be more apparent from the following description as presented in conjunction with the following several figures of the drawings.

FIG. 7 is a table numerically depicting the resulting memory device state differences between a randomized distribution and a modified memory device distribution in accordance with an embodiment of the disclosure;

Figure 1:
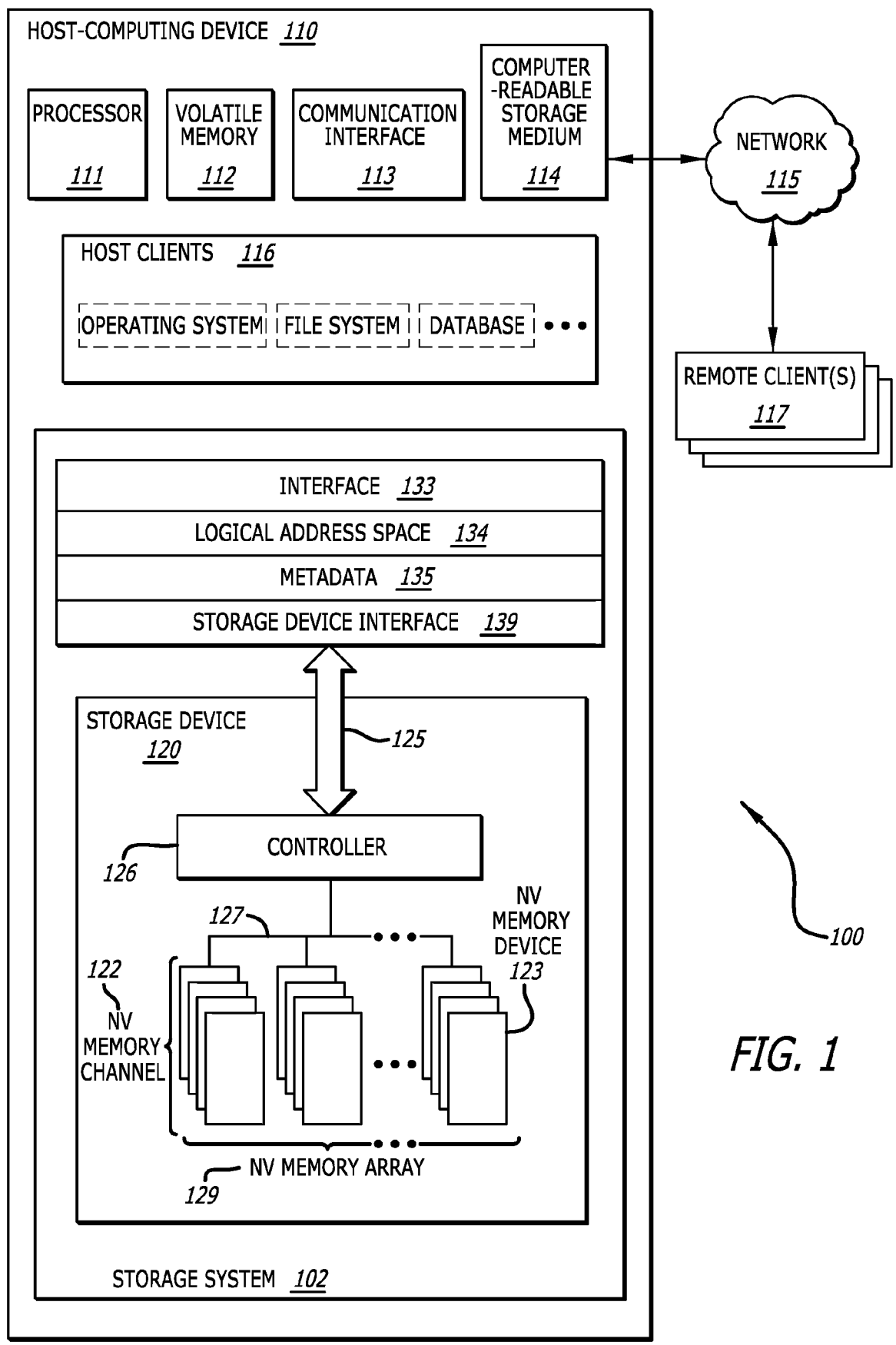
FIG. 1 is a schematic block diagram of a host-computing device with a storage device suitable for modified memory device state distribution in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the problems described above, devices and methods are discussed herein that modify the random distribution of memory state selection within memory arrays. In many embodiments, received host data is not stored directly within the memory array in the same format (meaning that a received series of values within the host data is not stored as those same series of values). There is often a translation done to change the received host data into a format that is more suited for storage within the memory array. This translation often occurs because of limitations or other requirements within the storage device. For example, because of the physical properties of memory devices, many storage devices utilize wear-leveling practices which attempt to evenly distribute data across all blocks so that they wear down at the same rate. Another example is that received host data is often randomized so that data trends to be stored equally at all memory device states within the memory array.

The storage device controller or some other specialized module logs this translation from received host data and stored randomized data. This is often stored as metadata, but can be configured as any type of data such that it may be properly associated with the stored randomized data and can be utilized at a later point in time to de-randomize the data and return the expected received data values. Traditional randomization methods within storage device provide each received piece of data processed an equal chance of ending up as any of the available memory device storage states. So, given a plurality of memory devices that can store up to eight unique states, a randomized piece of data has a one in eight chance of being stored as each of the available memory device states.

However, as stated above, various negative effects can occur to specific memory device states. Therefore, embodiments of the disclosure provide for a modified randomization process that can alter the distribution of memory devices states utilized such that the memory device states susceptible to negative effects can be selected less frequently (i.e., "minimized"). As a result, memory device states that do not suffer from negative effects as much as others can therefore be selected more often during this modified randomization process. A modified state distribution logic can be utilized to determine these groupings of memory device states and generate a modified randomization seed that can be utilized by a randomizer within the storage device to generate the desired modified distribution of memory device states.

In a variety of embodiments, a storage device will include a randomizer logic or hardware component that can accept a randomization seed that will instruct it on how to select values for various pages within the memory device. Traditional randomization methods provide an equal probability of either a one or zero being selected for each page, which results in an equally random distribution for all memory device states. In many embodiments, the modification of the memory state distribution can be accomplished through providing varying probabilities for the randomizer to select a one or zero to each of the available pages within the memory devices for programming. In this way, based on the coding scheme utilized and the values provided in the randomization seed, a modified distribution pattern of data within the memory device states can be achieved based on the desired application and negative effects to reduce.

To understand the extent of how modifying the randomized distribution can reduce negative effects, experimentations were done that programmed neighboring devices at opposite ends of the voltage threshold range. The difference in nearby electric fields can amplify the negative effects observed including vertical and/or lateral charge migration which affects data retention, as well as disturbs created by nearby reads and writes. Hence, a series of worst case scenarios were developed and measured under both a regular randomized distribution and a modified randomized distribution. The results showed that utilizing a modified randomization distribution yielded an approximate one-hundred and seventy-five percent reduction in data retention errors and an approximate three-hundred percent reduction in fail bit count of lower pages after a read disturb event. Thus, utilizing a modified randomized distribution provides tangible benefits that can increase the overall lifespan of the storage device.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/ or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1, a schematic block diagram of a host-computing device 110 with a storage system 102 suitable for modified memory device state distribution in accordance with an embodiment of the disclosure is shown. The control block management system 100 comprises one or more storage devices 120 of a storage system 102 within a host-computing device 110 in communication via a controller 126. The host-computing device 110 may include a processor 111, volatile memory 112, and a communication interface 113. The processor 111 may include one or more central processing units, one or more general-purpose processors, one or more application-specific processors, one or more virtual processors (e.g., the host-computing device 110 may be a virtual machine operating within a host), one or more processor cores, or the like. The communication interface 113 may include one or more network interfaces configured to communicatively couple the host-computing device 110 and/or controller 126 of the storage device 120 to a communication network 115, such as an Internet Protocol (IP) network, a Storage Area Network (SAN), wireless network, wired network, or the like.

The storage device 120, in various embodiments, may be disposed in one or more different locations relative to the host-computing device 110. In one embodiment, the storage device 120 comprises one or more non-volatile memory devices 123, such as semiconductor chips or packages or other integrated circuit devices disposed on one or more printed circuit boards, storage housings, and/or other mechanical and/or electrical support structures. For example, the storage device 120 may comprise one or more direct inline memory module (DIMM) cards, one or more expansion cards and/or daughter cards, a solid-state-drive (SSD) or other hard drive device, and/or may have another memory and/or storage form factor. The storage device 120 may be integrated with and/or mounted on a motherboard of the host-computing device 110, installed in a port and/or slot of the host-computing device 110, installed on a different host-computing device 110 and/or a dedicated storage appliance on the network 115, in communication with the host-computing device 110 over an external bus (e.g., an external hard drive), or the like.

The storage device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the storage device 120 may be disposed on a peripheral bus of the host-computing device 110, such as a peripheral component interconnect express (PCI Express or PCIe) bus such, as but not limited to a NVM Express (NVMe) interface, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the storage device 120 may be disposed on a communication network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The host-computing device 110 may further comprise computer-readable storage medium 114. The computer-readable storage medium 114 may comprise executable instructions configured to cause the host-computing device 110 (e.g., processor 111) to perform steps of one or more of the methods disclosed herein. Additionally, or in the alternative, the buffering component 150 may be embodied as one or more computer-readable instructions stored on the computer-readable storage medium 114.

A device driver and/or the controller 126, in certain embodiments, may present a logical address space 134 to the host clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the storage device 120 may maintain metadata 135, such as a logical to physical address mapping structure, to map logical addresses of the logical address space 134 to media storage locations on the storage device(s) 120. A device driver may be configured to provide storage services to one or more host clients 116. The host clients 116 may include local clients operating on the host-computing device 110 and/or remote clients 117 accessible via the network 115 and/or communication interface 113. The host clients 116 may include, but are not limited to: operating systems, file systems, database applications, server applications, kernel-level processes, user-level processes, applications, and the like.

In many embodiments, the host-computing device 110 can include a plurality of virtual machines which may be instantiated or otherwise created based on user-request. As will be understood by those skilled in the art, a host-computing device 110 may create a plurality of virtual machines configured as virtual hosts which is limited only on the available computing resources and/or demand. A hypervisor can be available to create, run, and otherwise manage the plurality of virtual machines. Each virtual machine may include a plurality of virtual host clients similar to host clients 116 that may utilize the storage system 102 to store and access data.

The device driver may be further communicatively coupled to one or more storage systems 102 which may include different types and configurations of storage devices 120 including, but not limited to: solid-state storage devices, semiconductor storage devices, SAN storage resources, or the like. The one or more storage devices 120 may comprise one or more respective controllers 126 and non-volatile memory channels 122. The device driver may provide access to the one or more storage devices 120 via any compatible protocols or interface 133 such as, but not limited to, SATA and PCIe. The metadata 135 may be used to manage and/or track data operations performed through the protocols or interfaces 133. The logical address space 134 may comprise a plurality of logical addresses, each corresponding to respective media locations of the one or more storage devices 120. The device driver may maintain metadata 135 comprising any-to-any mappings between logical addresses and media locations.

A device driver may further comprise and/or be in communication with a storage device interface 139 configured to transfer data, commands, and/or queries to the one or more storage devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The storage device interface 139 may communicate with the one or more storage devices 120 using input-output control (IO-CTL) command(s), IO-CTL command extension(s), remote direct memory access, or the like.

The communication interface 113 may comprise one or more network interfaces configured to communicatively couple the host-computing device 110 and/or the controller 126 to a network 115 and/or to one or more remote clients 117 (which can act as another host). The controller 126 is part of and/or in communication with one or more storage devices 120. Although FIG. 1 depicts a single storage device 120, the disclosure is not limited in this regard and could be adapted to incorporate any number of storage devices 120.

The storage device 120 may comprise one or more non-volatile memory devices 123 of non-volatile memory channels 122, which may include but is not limited to: ReRAM, Memristor memory, programmable metallization device memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon Oxide-Nitride-Oxide-Silicon (SONOS), programmable metallization device (PMC), conductive-bridging RAM (CBRAM), magneto-resistive RAM (MRAM), magnetic storage media (e.g., hard disk, tape), optical storage media, or the like. The one or more non-volatile memory devices 123 of the nonvolatile memory channels 122, in certain embodiments, comprise storage class memory (SCM) (e.g., write in place memory, or the like).

While the non-volatile memory channels 122 is referred to herein as "memory media," in various embodiments, the non-volatile memory channels 122 may more generally comprise one or more non-volatile recording media capable of recording data, which may be referred to as a non-volatile memory medium, a non-volatile memory device, or the like. Further, the storage device 120, in various embodiments, may comprise a non-volatile recording device, a non-volatile memory array 129, a plurality of interconnected storage devices in an array, or the like.

The non-volatile memory channels 122 may comprise one or more non-volatile memory devices 123, which may include, but are not limited to: chips, packages, planes, die, or the like. A controller 126 may be configured to manage data operations on the non-volatile memory channels 122, and may comprise one or more processors, programmable processors (e.g., FPGAs), ASICs, micro-controllers, or the like. In some embodiments, the controller 126 is configured to store data on and/or read data from the non-volatile memory channels 122, to transfer data to/from the storage device 120, and so on.

The controller 126 may be communicatively coupled to the non-volatile memory channels 122 by way of a bus 127. The bus 127 may comprise an I/O bus for communicating data to/from the non-volatile memory devices 123. The bus 127 may further comprise a control bus for communicating addressing and other command and control information to the non-volatile memory devices 123. In some embodiments, the bus 127 may communicatively couple the non-volatile memory devices 123 to the controller 126 in parallel. This parallel access may allow the non-volatile memory devices 123 to be managed as a group, forming a non-volatile memory array 129. The non-volatile memory devices 123 may be partitioned into respective logical memory units (e.g., logical pages) and/or logical memory divisions (e.g., logical blocks). The logical memory units may be formed by logically combining physical memory units of each of the non-volatile memory devices 123.

The controller 126 may organize a block of word lines within a non-volatile memory device 123, in certain embodiments, using addresses of the word lines, such that the word lines are logically organized into a monotonically increasing sequence (e.g., decoding and/ or translating addresses for word lines into a monotonically increasing sequence, or the like). In a further embodiment, word lines of a block within a non-volatile memory device 123 may be physically arranged in a monotonically increasing sequence of word line addresses, with consecutively addressed word lines also being physically adjacent (e.g., WL0, WL1, WL2, ... WLN).

The controller 126 may comprise and/or be in communication with a device driver executing on the host-computing device 110. A device driver may provide storage services to the host clients 116 via one or more interfaces 133. A device driver may further comprise a storage device interface 139 that is configured to transfer data, commands, and/or queries to the controller 126 over a bus 125, as described above.

Figure 2:
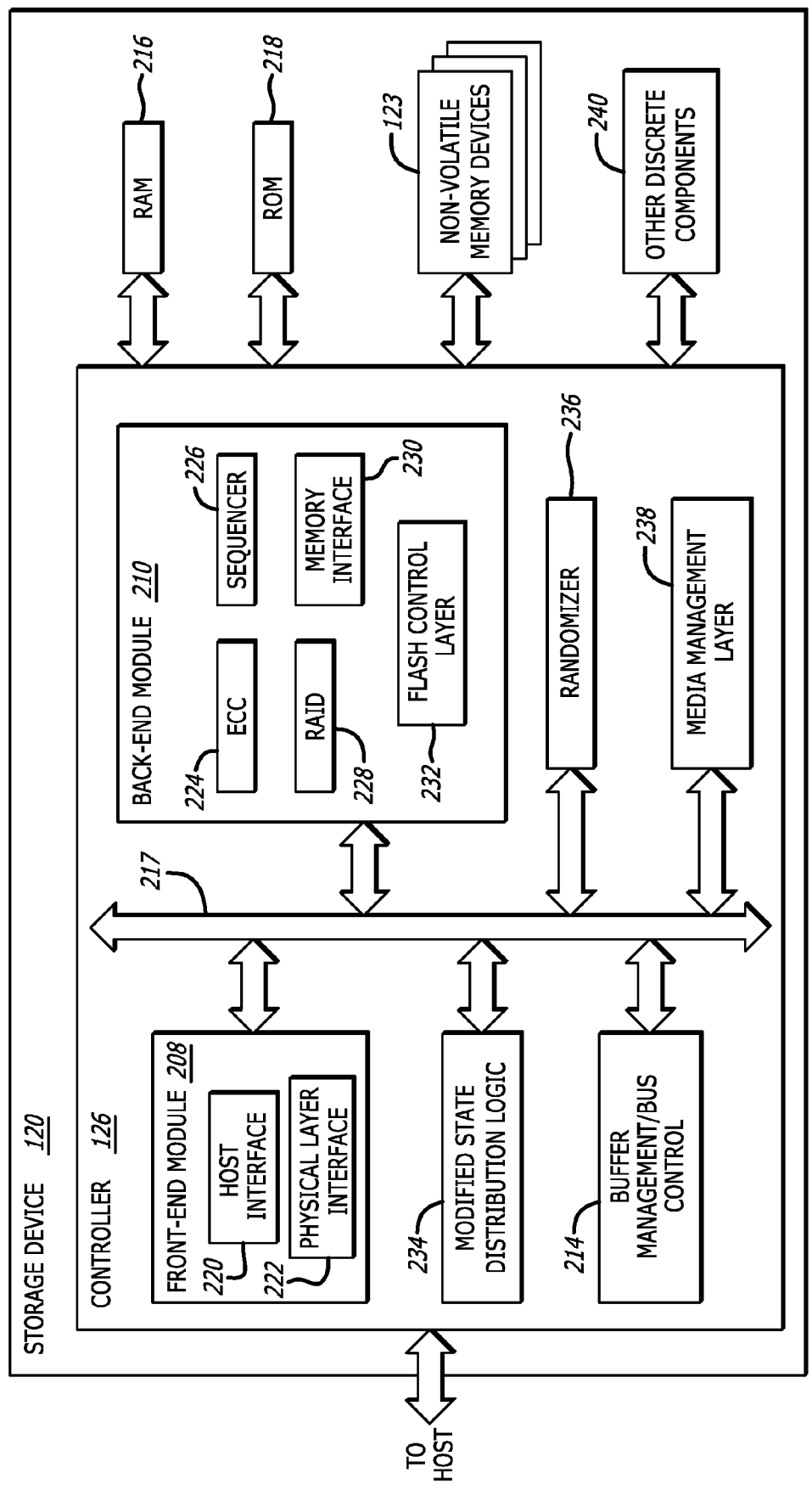
FIG. 2 is a schematic block diagram of a storage device suitable for modified memory device state distribution in accordance with an embodiment of the disclosure.

Referring to FIG. 2, a schematic block diagram of a storage device 120 suitable for modified memory device state distribution in accordance with an embodiment of the disclosure. The controller 126 may include a front-end module 208 that interfaces with a host via a plurality of high priority and low priority communication channels, a back-end module 210 that interfaces with the non-volatile memory devices 123, and various other modules that perform various functions of the storage device 120. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 126 may include a buffer management/bus control module 214 that manages buffers in random access memory (RAM) 216 and controls the internal bus arbitration for communication on an internal communications bus 217 of the controller 126. A read only memory (ROM) 218 may store and/or access system boot code. Although illustrated in FIG. 2 as located separately from the controller 126, in other embodiments one or both of the RAM 216 and the ROM 218 may be located within the controller 126. In yet other embodiments, portions of RAM 216 and ROM 218 may be located both within the controller 126 and outside the controller 126. Further, in some implementations, the controller 126, the RAM 216, and the ROM 218 may be located on separate semiconductor dies. As discussed below, in one implementation, the submission queues and the completion queues may be stored in a controller memory buffer, which may be housed in RAM 216.

Additionally, the front-end module 208 may include a host interface 220 and a physical layer interface 222 that provides the electrical interface with the host or next level storage controller. The choice of the type of the host interface 220 can depend on the type of memory being used. Examples types of the host interfaces 220 may include, but are not limited to, SATA, SATA Express, SAS, Fibre Channel, USB, PCIe, and NVMe. The host interface 220 may typically facilitate transfer for data, control signals, and timing signals.

The back-end module 210 may include an error correction controller (ECC) engine 224 that encodes the data bytes received from the host and decodes and error corrects the data bytes read from the non-volatile memory devices 123. The back-end module 210 may also include a command sequencer 226 that generates command sequences, such as program, read, and erase command sequences, to be transmitted to the non-volatile memory devices 123. Additionally, the back-end module 210 may include a RAID (Redundant Array of Independent Drives) module 228 that manages generation of RAID parity and recovery of failed data. The RAID parity may be used as an additional level of integrity protection for the data being written into the storage device 120. In some cases, the RAID module 228 may be a part of the ECC engine 224. A memory interface 230 provides the command sequences to the non-volatile memory devices 123 and receives status information from the non-volatile memory devices 123. Along with the command sequences and status information, data to be programmed into and read from the non-volatile memory devices 123 may be communicated through the memory interface 230. A flash control layer 232 may control the overall operation of back-end module 210.

Additional modules of the storage device 120 illustrated in FIG. 2 may include a media management layer 238, which performs wear leveling of memory devices of the non-volatile memory devices 123. The storage device 120 may also include other discrete components 240, such as external electrical interfaces, external RAM, resistors, capacitors, or other components that may interface with controller 126. In alternative embodiments, one or more of the RAID modules 228, media management layer 238 and buffer management/bus control module 214 are optional components that may not be necessary in the controller 126.

Storage device 120 may also include a randomizer 236 to randomize the incoming host data prior to storage within the non-volatile memory devices 123. As previously discussed, the randomizer can be provided a randomization seed which can consist of probabilities to assign each page within a memory device to determine if it will be programmed as a one or a zero. If the randomization seed is evenly distributed (i.e., each probability is set at fifty percent), then the overall distribution of the memory device states within the non-volatile memory devices 123 will trend toward an equal distribution across all states. However, by providing a modified randomization seed, the distribution of the states within the non-volatile memory devices 123 can trend toward unequal distributions. These unequal distributions can be configured to favor certain memory device states over others. In a variety of embodiments, in order to avoid certain negative effects that occur in particular memory device states, one or more states may be grouped together to minimize or otherwise reduce their selection. These modified distribution patterns can reduce the exposure to these negative effects and thus improve the overall lifespan of the storage device 120.

In a number of embodiments, the randomizer 236 will generate log data that can be utilized to de-randomize the stored data and convert it back to the host data values that were originally received. This log data may be formatted as metadata which may be stored in the memory array similar to the randomized data or may be stored in additional formats within one or more specialized log data locations or RAM 216. As described in more detail in the descriptions of FIGS. 8 and 9, some embodiments may first randomize received host data with a traditional randomization distribution, and then re-randomize the randomized data with a modified distribution pattern. The randomizer 236 in these embodiments can generate and store the additional log data to provide a method to de-randomize the stored data through both the randomization and re-randomization process.

Finally, the controller 126 may also comprise a modified state distribution logic 234. In a variety of embodiments, the modified state distribution logic 234 can be configured to facilitate the modification of the randomization distributions utilized within the storage device 120. In some embodiments, the modified state distribution logic 234 can determine the number of discrete states that can be programmed within the non-volatile memory devices 123. Once determined, the modified state distribution logic 234 can access what type of modification may be necessary and group the necessary memory device states together in order to reduce their selection. In further embodiments, the modified state distribution logic 234 can generate a modified randomization seed based on prior usage determinations and provide it to the randomizer to adjust the random distribution. In still further embodiments, when switching randomization distribution patterns, the modified state distribution logic 234 can direct the controller 126 to re-distribute previously stored data in order to effect this change across all data within the memory array. In many embodiments, this redistribution of previously stored data can be configured to occur during storage device downtimes or other dips in usage.

Figure 3:
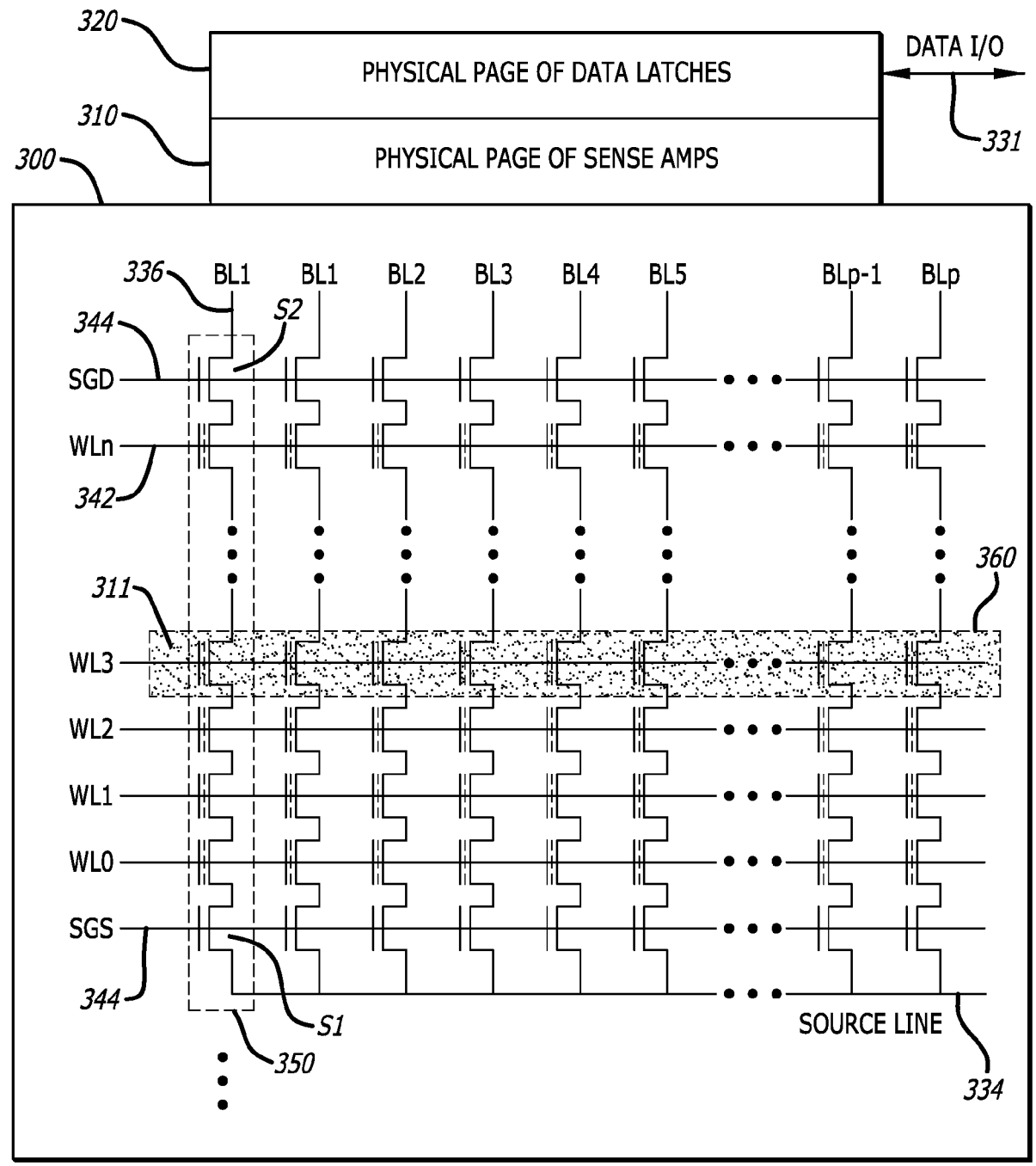
FIG. 3 is a conceptual schematic diagram of a two-dimensional memory array in accordance with an embodiment of the disclosure.

Referring to FIG. 3, a conceptual illustration of a page of memory cells, organized for example in the NAND configuration 300, being sensed or programmed in parallel in accordance with an embodiment of the invention is shown. FIG. 3 conceptually shows a bank of NAND strings 350 within a non-volatile memory device 123 of FIG. 1. A 'page' such as the page 360, is a group of memory cells enabled to be sensed or programmed in parallel. This is accomplished in the peripheral circuits by a corresponding page of sense amplifiers 310. The sensed results are utilized in latches within a corresponding set of data latches 320. Each sense amplifier can be coupled to a NAND string, such as NAND string 350 via a bit line 336. For example, the page 360 is along a row and is sensed by a sensing voltage applied to the control gates of the cells of the page connected in common to the word line WL3. Along each column, each memory cell such as memory cell 311 is accessible by a sense amplifier via a bit line 336. Data in the data latches 220 are toggled in from or out to the memory controller 126 via a data I/O bus 331.

The NAND string 350 can be a series of memory cells, such as memory cell 311, daisy-chained by their sources and drains to form a source terminal and a drain terminal respective at its two ends. A pair of select transistors S1, S2 can control the memory cell chain's connection to the external source via the NAND string's source terminal and drain terminal, respectively. In a memory array, when the source select transistor S1 is turned on, the source terminal is coupled to a source line 334. Similarly, when the drain select transistor S2 is turned on, the drain terminal of the NAND string is coupled to a bit line 336 of the memory array. Each memory cell 311 in the chain acts to store a charge. It has a charge storage element to store a given amount of charge so as to represent an intended memory state. In many embodiments, a control gate within each memory cell can allow for control over read and write operations. Often, the control gates of corresponding memory cells of each row within a plurality of NAND strings are all connected to the same word line (such as WL0. WL1 ... WLn 342). Similarly, a control gate of each of the select transistors S1, S2 (accessed via select lines 344 SGS and SGD respectively) provides control access to the NAND string via its source terminal and drain terminal respectively.

While the example memory device referred to above comprises physical page memory cells that store single bits of data, in most embodiments each cell is storing multi-bit data, and each physical page can have multiple data pages. Additionally, in further embodiments, physical pages may store one or more logical sectors of data. Typically, the host-computing device 110 (see FIG. 1) operating with a disk operating system manages the storage of a file by organizing the content of the file in units of logical sectors, which is typically in one or more units of 512 bytes. In some embodiments, a physical page may have 16 kB of memory cells being sensed in parallel by corresponding 16 kB of sense amplifiers via 16 kB of bit lines. An example logical sector assigned by the host has a size of 2 kB of data. Thus, a physical page can store 8 sectors if the cells are each configured to store 1 bit of data (SLC). For MLC, TLC, and QLC and other increased density structures, each cell can store 2, 3, 4 or more bits of data, and each physical page can store 16, 32, 64 or more logical sectors depending on the structure utilized.

One unique difference between flash memory and other types of memory is that a memory cell must be programmed from an erased state which is associated with no charge within the memory cell. This requires that the floating gate must first be emptied of charge prior to programming. Programming adds a desired amount of charge back to the floating gate. It does not support removing a portion of the charge from the floating to go from a more programmed state to a lesser one. Thus, new data cannot overwrite existing data and must be written to a previously unwritten or erased location. Furthermore, erasing all the charges from a floating gate can often take an appreciable amount of time. For that reason, it will be cumbersome and inefficient to erase cell by cell or even page by page. Therefore, in most embodiments, the array of memory cells is often divided into a large number of blocks. As is common in many flash-based memory systems, the block is the unit of erase. That is, each block contains the minimum number of memory cells that are erased in one action. This combined with the limited lifespans of memory cells within the flash memory increases the desire to limit the amount of erasing and programming occurring within the storage device.

Figure 4:
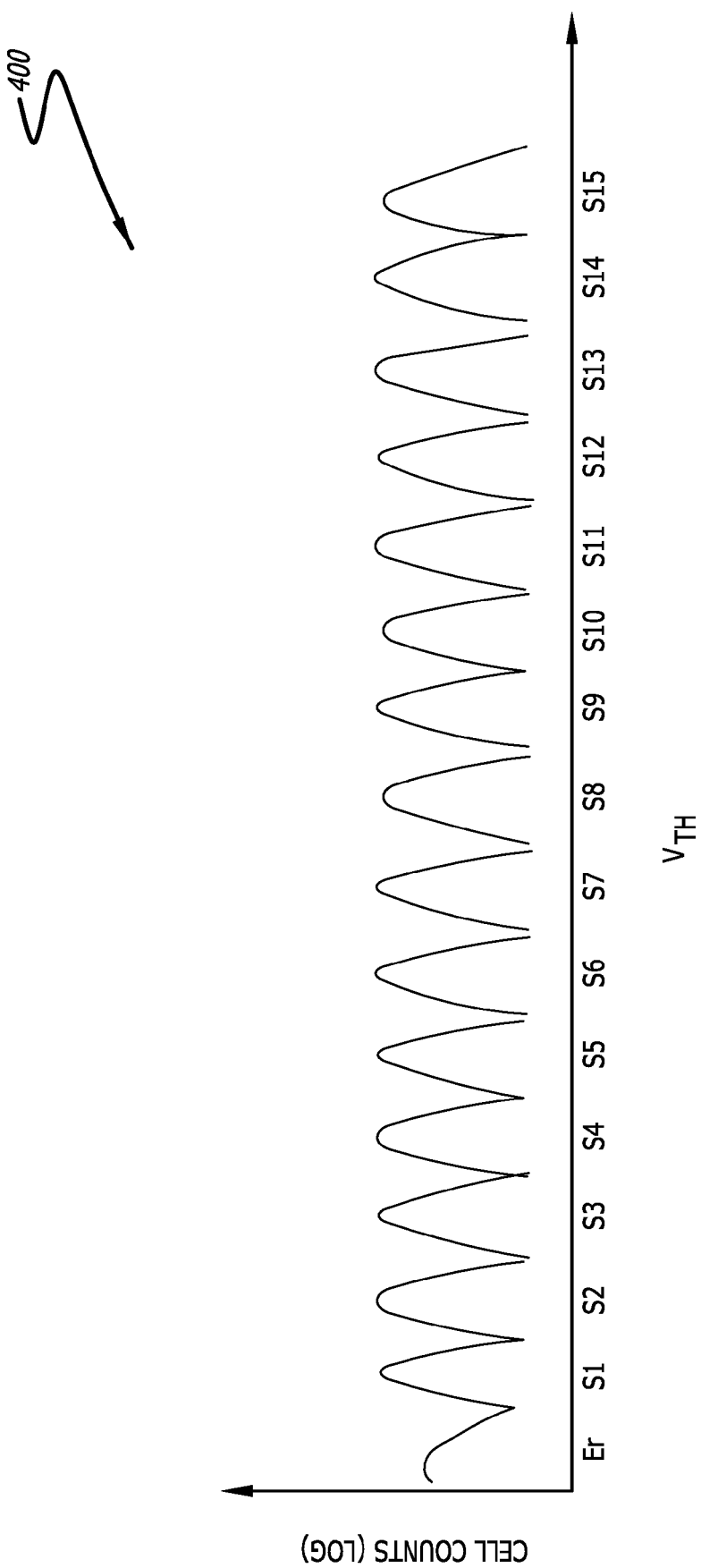
FIG. 4 is a conceptual diagram of various memory states available within a memory device in accordance with an embodiment of the disclosure.

Referring to FIG. 4, a conceptual diagram of various memory states available within a memory device in accordance with an embodiment of the disclosure is shown. The graph 400 depicted in FIG. 4 shows a conceptual example of a memory device that can store 4-bits of data which can be represented by one of 16 values or "states" stored within the memory device. The erased state ("Er") can represent a group state value. The subsequent states (S1 - S15) can each represent other unique values. The horizontal axis depicts a range of voltage thresholds ("$V_{Th}$") which can represent an increase level of electrical charge that is stored within the memory device. As more electrical charge is stored within the memory device, the representative state also increases up to S15.

This graph 400 depicts what a typical distribution of state values can be within a traditional storage device. In order to reduce overall wear and tear on the memory devices, the controller (or some task-specific module) within the storage device will randomize the incoming host data such that each stored value has an equal chance of being any of the available states. Thus, an ideal distribution in traditional storage devices looks similar to the distribution of FIG. 4. Those skilled in the art will recognize that an actual distribution of stored values within a storage device will likely not be this equally divided due to various factors.

Figure 5:
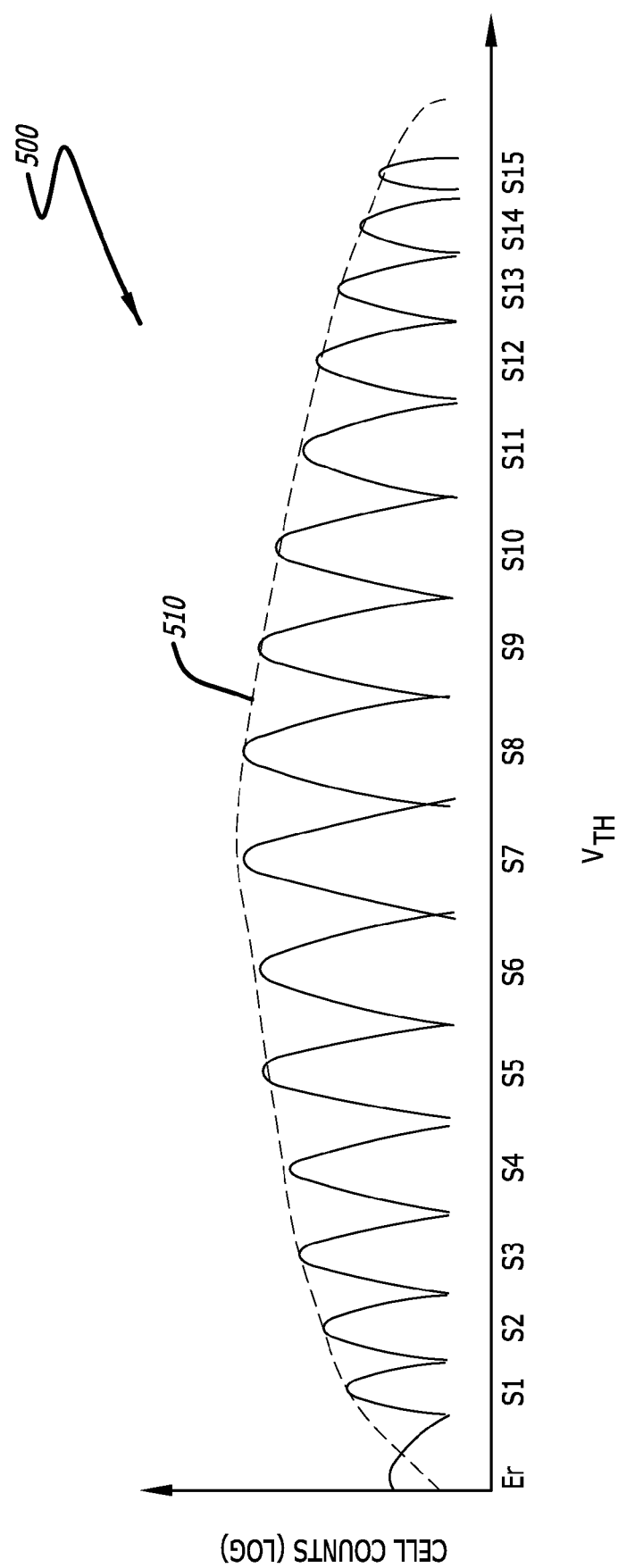
FIG. 5 is a conceptual diagram of a modified distribution of the memory states available within a memory device in accordance with an embodiment of the disclosure.

Referring to FIG. 5, a conceptual diagram of a modified distribution of the memory states available within a memory device in accordance with an embodiment of the disclosure is shown. As described above with respect to FIG. 4, traditional storage devices utilize a scheme of equal distribution among the available states within the memory devices. In this method, the controller or other module within the storage device aims to program an equal number of memory devices to an equal number of states. This method is often called a randomized distribution.

However, memory devices with data stored in the lower range of voltage threshold levels often suffer from program disturb and read disturb errors. For example, in QLC memory devices, this can affect the erase "Er" state and S1. This can occur when a neighboring memory device is programmed or read from. The actions occurring on the physically neighboring memory device can unintentionally affect the charge stored within the uninvolved memory device. Thus, the lower states programmed into a memory device can have a much larger chance of being inadvertently changed from outside actions.

Likewise, memory devices with data stored in the upper range of the voltage threshold range can suffer from data retention errors. For example, in QLC memory devices, states S14 and S15 may be affected by this problem. In many memory devices, stored charge may dissipate over time or due to other factors. As such, memory devices programmed in states with a higher electrical charge can eventually drift or be read as being in a different state than what was originally programmed. Correcting for this requires other data and/or hardware to account for. Thus, in memory devices such as QLC memory devices, up to twenty-five percent of the available memory states can be negatively affected by these various disturbs and errors.

Embodiments of the disclosure attempt to minimize the dependence on these negatively affected states as shown by the modified distribution of FIG. 5. It is contemplated that other distributions are possible depending on the application desired and the embodiment depicted in FIG. 5 is one of many possible modifications. The graph 500 displays a voltage threshold range similar to the one shown in FIG. 4. The embodiment depicted is a QLC memory device that is configured to store a 4-bit value via programming the memory device to one of sixteen available states.

The states on either end of the voltage threshold range are minimized while the states toward the middle of the distribution are increased. This modified distribution can be deployed as applying a Gaussian curve 510 with a wide distribution across the available states. In this way, the number of memory device that are programmed into the bottom and top of the voltage threshold range are relatively minimized in order to avoid the stored data suffering from either a disturb or error. Because the odds of a memory device suffering from these disturbs and/or errors is reduced, the overall memory array and storage device can have an extended life cycle. The overall process to achieve this is described below.

Figure 6:
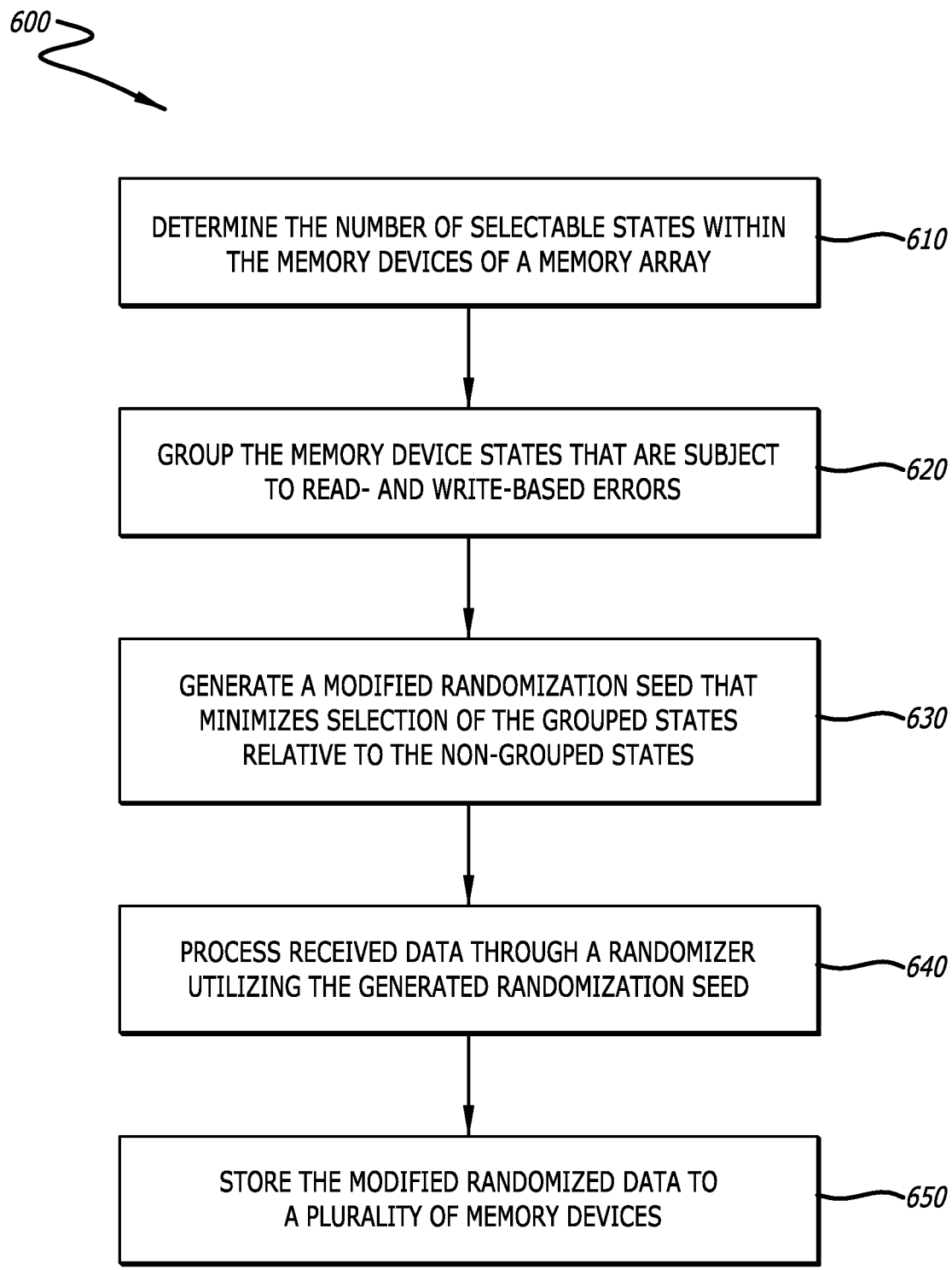
FIG. 6 is a flowchart depicting a high-level process for modifying the distribution of memory device states in accordance with an embodiment of the disclosure.

Referring to FIG. 6, a flowchart depicting a high-level process 600 for modifying the distribution of memory device states in accordance with an embodiment of the disclosure is shown. Because memory devices can vary in the amount of memory states that may be stored within them, the process 600 can first determine the number of selectable memory states within the memory device of the memory array (block 610). In some embodiments, the memory array may comprise multiple types of memory devices or may utilize memory devices that can be dynamically configured to be programmed with different numbers of memory states. Therefore, this step may be repeated as the configuration of the memory array changes.

Once determined, the storage device can group or select memory states within the available memory states of the memory devices that can be susceptible to disturbs, errors, or other negative effects (block 620). In some embodiments, the process 600 can create multiple groups including a first group that will be minimized and a second group comprising memory states not in the first group that will not be minimized and may be relied upon more to store data. In further embodiments, configurations may occur wherein multiple groups are created to provide different levels of modification. By way of example and not limitation, a memory array may be configured with specialized memory devices that are less susceptible to data retention errors on the higher memory states. Thus, a first group for the lower states is created that is highly minimized, a second group for the upper states is created that somewhat minimizes their selection, and a third group that is comprised of memory states not in the first or second group that is more relied upon for selection to store data. Various alternative configurations are shown more in the discussion of FIG. 10 below.

Once grouped, many embodiments of the process 600 will generate a modified randomization seed that is configured to minimized selection of the grouped states compared to non-grouped or other group states (block 630). Randomization seeds will be discussed more below in FIG. 7, but can be briefly understood as the way a randomizer within a storage device selects what state will be utilized for storage of data. A number of embodiments will create modified distributions of memory states by utilizing the randomizer to adjust or supplement the selection of memory device states.

Once programmed, the randomizer can then process received data to generate a modified distribution of memory states by utilizing the generated randomization seed (block 640). Upon being randomized, the modified randomized data can be stored into a plurality of the memory devices (block 650). As more data is stored within the memory array, the distribution of memory device states will trend to look more like the modified distribution instead of the equally randomized distribution. A numerical breakdown of how this can occur in an example distribution is shown below.

Referring to FIG. 7, a table numerically depicting the resulting memory device state differences between a randomized distribution and a modified memory device distribution in accordance with an embodiment of the disclosure is shown. The table shown depicts a QLC memory device that can be configured in one of sixteen memory states 750 (Er - S15). The QLC memory devices can store up to four bits which are comprised of four pages 710. These pages 710 include a lower page (LP), middle page (MP), upper page (UP), and top page (TP). Each of the states 750 comprises a unique combination of values within the pages 710.

The unique combinations of values are themselves comprised of various binary arrangements of 0 s or 1 s which are selected by the randomizer in many embodiments. A traditional probability distribution seed of these values is shown in the "Random" columns 770. Here, The probability of each page being programmed as a 0 or a 1 is 0.5 or fifty percent. In this way, each page of the memory device can be selected to store either value equally, which results in an equal chance for any of the sixteen available states 750 being selected. This equates with a one in sixteen chance which is reflected in the random distribution row showing the probability of each state being selected (shown as "P(state) Random dist." 720) equaling 0.0625. Because each of the sixteen states 750 can be selected, given a distribution of 16000 memory devices being programmed, the number of memory devices programmed in each state 750 will equal 1000 as shown in the random distribution of the device population (shown as "Device pop... - Random dist." 730).

However, in many embodiments of the invention, the distribution of the memory states 750 within a memory array can be altered by modifying the randomization seed as shown in the modified columns 780 (shown as "Mod."). The modified randomization probabilities as a group can be understood as a "seed" to generate a modified distribution of memory states 750. The modified randomization seed in the modified columns 780 alters the probability of a page within the memory device to be selected as a 0 in the middle, upper, and top pages (via increased probabilities of seventy percent, ninety percent, and seventy percent respectively). Conversely, the lower page is modified such that it is more likely to be programmed with a one rather than a zero (at sixty percent probability to be selected as storing a one bit).

As a result of this modified randomization seed, the probability of each state 750 being selected is also altered. The specific distribution based on the randomization seed shown in the embodiment of FIG. 7 is given in the modified probability state row (shown as "P(state) - Mod." 720). We can see that states Er - S3 and S12 - S15 have a lower chance of being selected compared to S4 - S11 states. For example, states S6 and S8 have an 11.34% chance of being selected compared to S15 which has a 0.36 percent chance of being selected. Previously, a traditional randomized distribution would lead to each memory state 750 having a 6.25% chance of being selected. In the embodiment depicted in FIG. 7, state S9 has an approximately 26.46% chance of being selected. Indeed, the "large device population" states of S4 - S11 have a combined eighty-two percent chance of being selected, thus minimizing the chances of a lower or higher state being selected for programming within a memory device.

Of course, while a purely Gaussian distribution can be desired, it is seen that generating modified memory device programming distributions via a modified randomization seed may yield distributions that are not purely Gaussian but approximate Guassian distributions. Various embodiments comprise modified distributions that have one or more states configured with a smaller or non-Gaussian probability compared to the other states. In the distribution embodiment depicted in FIG. 7 for example, state S7 has a 4.86% chance of being selected compared to the other neighboring states S6 and S8 which each have a 11.34% chance of being selected. Such non-Gaussian modified state distributions can occur while still keeping the overall central, unaffected memory states with a larger overall probability of being selected compared to the negatively affected memory states.

It is contemplated that various embodiments may include alternative randomization seeds based on the coding associated with the pages of the memory devices. Indeed, embodiments can be configured with a page coding scheme and randomized probability seed that can yield Gaussian distributions as needed. As shown in more detail in the discussion of FIG. 10, other types of modified distributions may be desired which can also be realized by providing a modified randomization seed to the randomizer. Indeed, many embodiments of the disclosure can utilize randomization and programming processes already deployed and achieve the desired benefits by simply modifying the randomization probabilities. In certain embodiments, this can be done via a firmware update without the need for additional equipment. More specific types of deployment and processing is discussed below in FIGS. 8 and 9.

Figure 8:
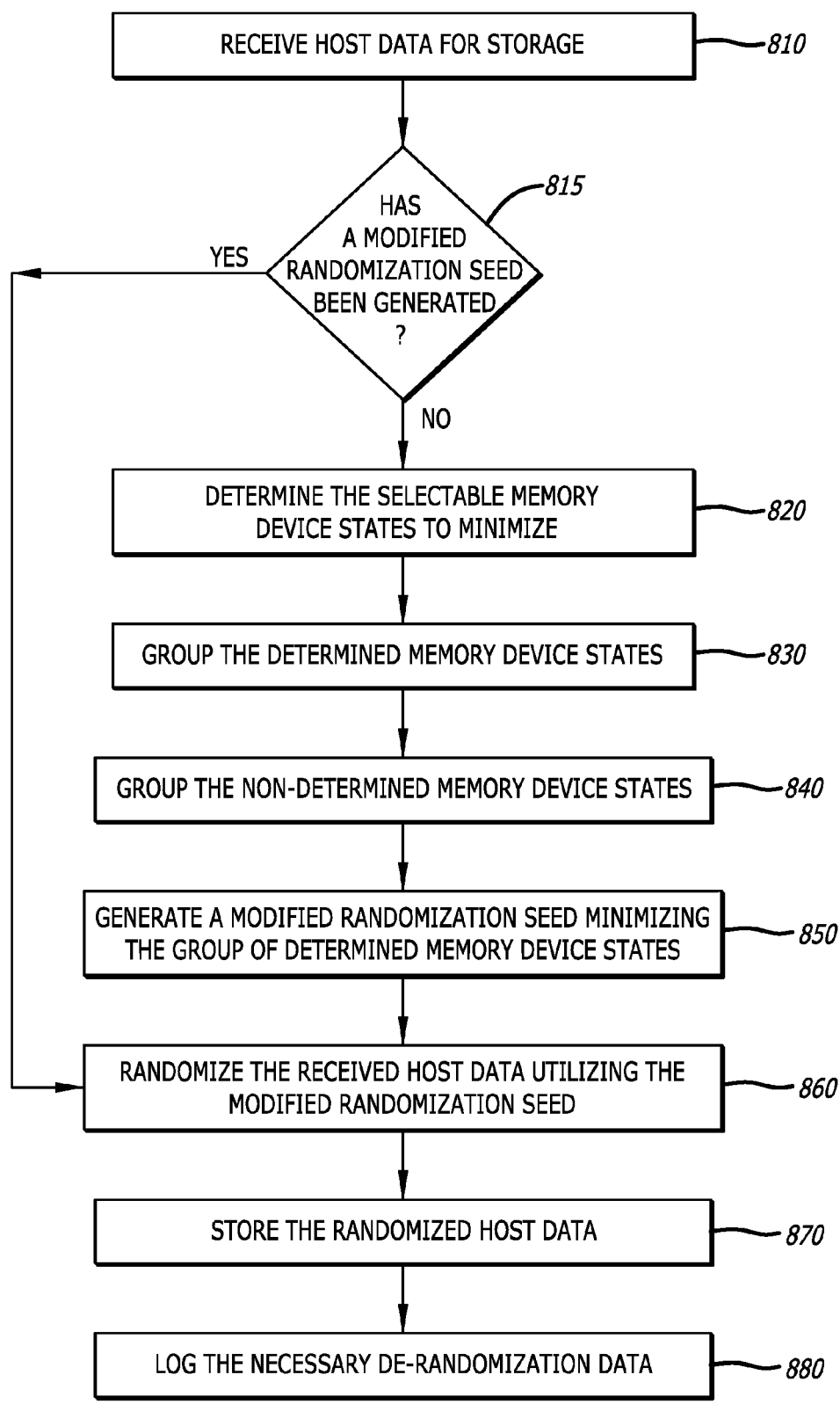
FIG. 8 is a flowchart depicting a process for directly modifying the memory device distribution of incoming host data in accordance with an embodiment of the disclosure.

Referring to FIG. 8, a flowchart depicting a process 800 for directly modifying the memory device distribution of incoming host data in accordance with an embodiment of the disclosure is shown. In various embodiments, the modification of the randomization may be done directly to the host data being received and stored. In these embodiments, the process 800 can begin upon receiving host data for storage (block 810). Upon receipt, the storage device can determine if a modified randomization seed has been generated (block 815). In some embodiments, the storage device may ship with a static modified randomization seed. In further embodiments, the modified randomization seed may be dynamically generated based on a number of factors. These factors can include, but are not limited to, current storage device capacity, being comprised of memory devices more susceptible to disturb errors or data retention errors, and/or having recently changed randomization schemes.

When a modified randomization seed has already been generated and is available, the storage device can then randomize the received host data utilizing the modified randomization seed (block 860). In the event that no modified randomization seed has been generated or is present, the process 800 can then determine the selectable memory device states to minimize (block 820). As discussed previously, the number of memory states that can be stored within a given memory device has typically increased over time. Also, some storage devices may have memory devices that include hybrid or dual-use memory devices that may change the number of selectable states available at any given time. However, in many embodiments, the states that correspond to voltage thresholds that lie in the upper and lower twelve to twenty-five percent of the entire range may be susceptible to certain negative effects. As such, in certain embodiments, the determination of the selectable memory device states to minimize includes determining what current memory states reside in that upper and lower range of the available voltage threshold range within the available memory devices.

Upon determination of what memory device states to minimize, these states can be grouped together (block 830). The remaining memory states that were not determined to be minimized can then be grouped together as a second group (block 840). However, in various embodiments, the non-grouped memory states can be identified not as a second group, but just as any memory states that are not within the first group. As discussed previously, in a number of embodiments, there could be more than one or two groupings within the process 800. Indeed, any number of groupings can occur based on the desired application and can occur when different rules are to be utilized in different groups. The number of groups is only limited by the number of available memory states.

Based on these groupings, the process 800 can generate a modified randomization seed that minimizes the group of determined memory device states (block 850). It is contemplated that in certain embodiments, instead of generating the modified randomization seed based on what memory states are to be minimized, the generation can instead be determined based on a group of memory states that are to be maximized or otherwise increased from a traditional random distribution. Once the modified randomization seed has been generated, the storage device (typically via a randomizer) can then randomize the received host data using that modified randomization seed (block 860).

Once randomized, the data can then be stored within the plurality of memory devices required (block 870). In order to de-randomize the data that has been stored in the memory devices, some de-randomization data can also be logged as necessary (block 880). In some embodiments, this log data may be done within the storage device controller. In certain embodiments, the de-randomization log data can be stored within a specialized plurality of memory devices. An alternative method of modifying the randomization of data within a storage device is shown below in FIG. 9.

Figure 9:
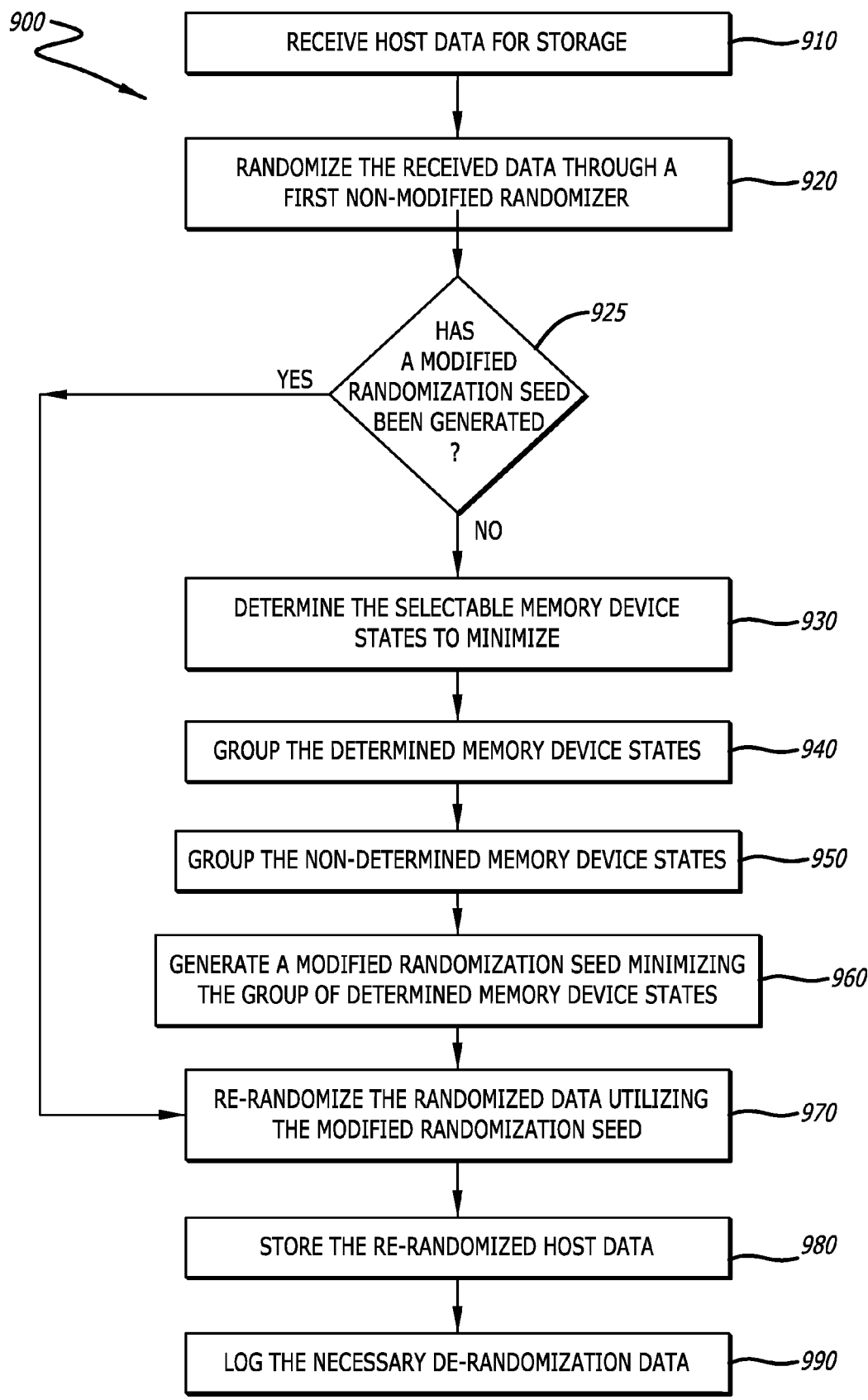
FIG. 9 is a flowchart depicting a process for redistributing a randomized memory device distribution in accordance with an embodiment of the disclosure.

Referring to FIG. 9, a flowchart depicting a process for redistributing a randomized memory device distribution in accordance with an embodiment of the disclosure is shown. In certain embodiments, direct modification of the randomization process may not be possible or feasible. In these embodiments, it may be preferred to first generate a traditional randomization of the received host data and then to modify that randomized data in a subsequent step before storage. The process 900 depicts such a two-step system by first receiving host data for storage (block 910). The received data is then randomized within a non-modified (i.e., traditional) randomizer (block 920). Once randomized, many embodiments may behave similarly to the process 800 depicted in FIG. 8.

The storage device can determine if a modified randomization seed has been generated (block 925). In some embodiments, the storage device may ship with a static modified randomization seed. In further embodiments, the modified randomization seed may be dynamically generated based on a number of factors as outlined above in FIG. 8. When a modified randomization seed has already been generated and is available, the storage device can then re-randomize the received host data utilizing the modified randomization seed (block 970).

In the event that no modified randomization seed has been generated or is present, the process 900 can then determine the selectable memory device states to minimize (block 930). Upon determination of what memory device states are to be minimized, these states can be grouped together (block 940). The remaining memory states that were not determined to be minimized can then be grouped together as a second group (block 950). However, as discussed above with respect to FIG. 8, the non-grouped memory states can be identified not as a second group in certain embodiments, but just as any memory states that are not within the first group. There may also be more than one or two groupings within the process 900. Indeed, any number of groupings can occur based on the desired application and can occur when different rules are to be utilized in different groups. The number of groups is again only limited by the number of available memory states.

Based on these groupings, the process 900 can generate a modified randomization seed that minimizes the group of determined memory device states (block 960). Once the modified randomization seed has been generated, the storage device can then re-randomize the received host data using that modified randomization seed (block 970). The re-randomized data can then be stored within the plurality of memory devices required (block 980). In order to de-randomize the data that has been stored in the memory devices, two sets of de-randomization data can also be logged as necessary (block 990). This process 900 provides a drawback in that increased storage must be made for two sets of de-randomization data (one set to de-randomize the modified randomization and a second set to de-randomize the traditional randomization). However, for various embodiments, this process 900 can provide a method of modifying the randomized distribution when a direct modification to the randomization may not be possible.

Figure 10:
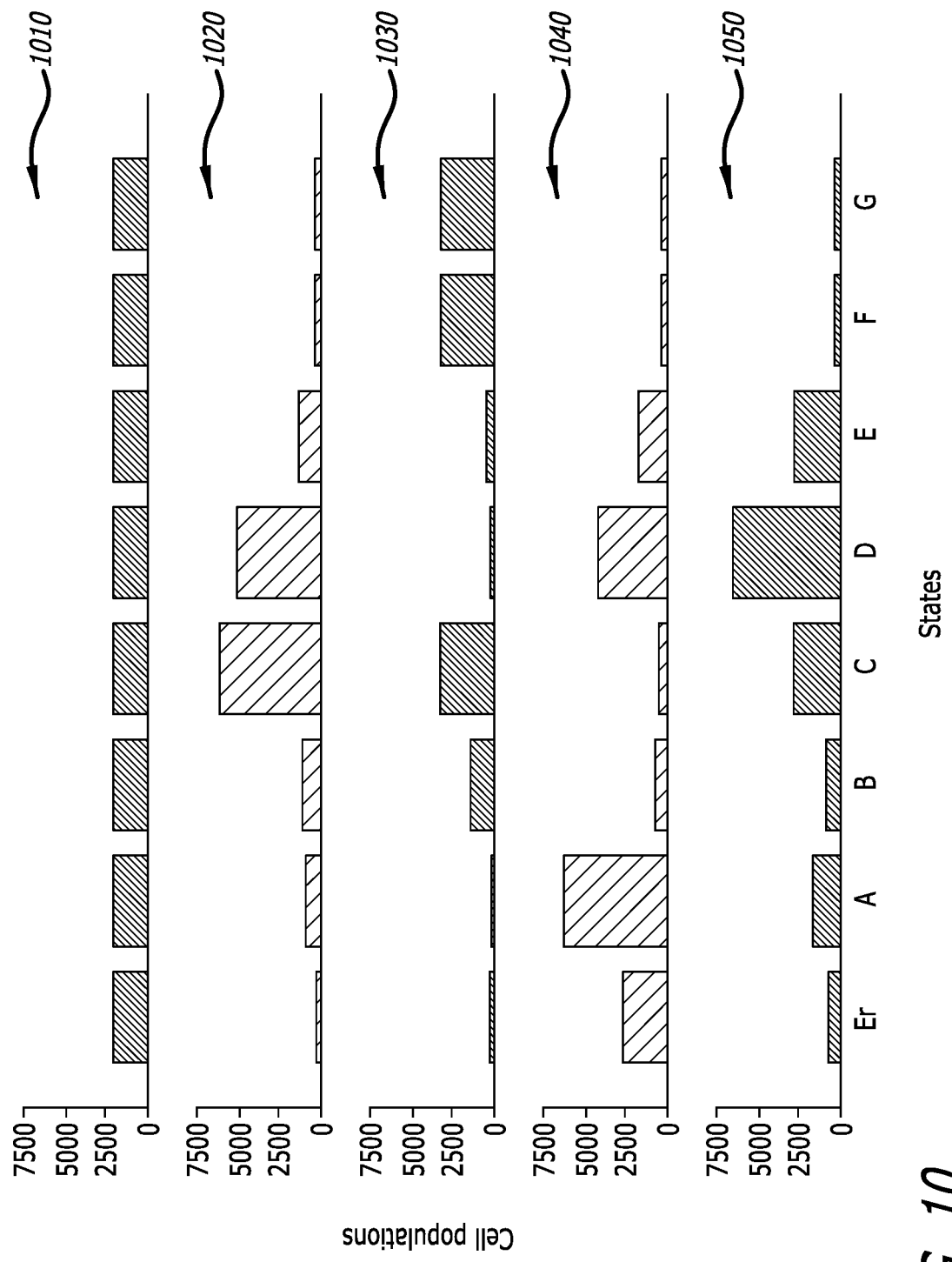
FIG. 10 is a conceptual depiction of various modified memory device state distributions associated with specific use cases in accordance with an embodiment of the disclosure.

Referring to FIG. 10, a conceptual depiction of various modified memory device state distributions 1020 - 1050 associated with specific use cases in accordance with an embodiment of the disclosure is shown. As discussed previously, many embodiments of the disclosure can be configured with a variety of differently modified randomized distributions. In a number of these embodiments, the type of modification can be dynamically changed based on a number of thresholds including, but not limited to, deployment environment, application type, and/or memory device properties. The memory device state distributions 1010 - 1050 depict these various modifications in TLC memory devices comprising eight unique memory device states.

The first distribution is a traditional randomized memory device distribution 1010. As discussed above, the traditional method of selecting memory device states was to provide an equal chance for each memory device state to be selected, which yielded over time an equal number of memory device states utilized within the memory array. A modified distribution, such as those discussed in previous figures is shown in the first modified memory state distribution 1020. This distribution 1020 minimizes negative effects in general purpose storage devices that occur in general operation. These negative effects include both read and write disturbs on the lower threshold states, as well as data retention errors that may occur in the upper threshold states.

However, in some embodiments the host computing device may require a read-intensive workload that includes accessing particular logical block address ranges within the storage device often. In these areas of the storage device, the threat of data retention errors is reduced based on the usage pattern of the host computing device. As such, various embodiments of the disclosure can dynamically utilize a read-intensive modified randomized distribution 1030 which can retain the reduced usage of the lower threshold memory device states of the regular modified distribution 1020 but may allow (or in some embodiments even increase) the amount of memory states that may be selected and stored in the upper memory device states. The storage device may also be configured to dynamically fine-tune the read-intensive modified randomized distribution 1030 to even further reduce or minimize the use of lower threshold memory device states in order to avoid the higher probability of read disturb errors that can occur from the increased read operations requested from the host computing device. It is contemplated that this type of distribution can be applied to a partial area of the memory array while another type of distribution can be implemented in another area of the memory array.

In further embodiments, the stored data may be written to long-term storage. These use cases can often occur in data storage centers or automotive devices. In these cases, the memory devices are more susceptible to data retention errors and less susceptible to read and/or program disturbs. Thus, in these embodiments, the storage device can dynamically configure the data to reduce the number of higher threshold memory device states that are selected and while retaining, or at least increasing the number of lower threshold memory device states selected. This cold data modified randomization distribution 1040 can be applied to an entire memory array or may be dynamically applied to a portion of the memory array as needed. Indications of long-term storage can be derived from usage/access patterns within the storage device or may be discerned from data received from the host-computing device. In still further embodiments, the storage device can be presented as a long-term storage device and can be preconfigured with the cold data modified randomization distribution 1040 to be utilized on all received data.

In additional embodiments, a code modified randomization distribution 1050 may be utilized based on the type of coding utilized within the memory devices. For example, a plurality of TLC memory devices within the memory array may be configured with a 1-3-3 coding. This coding signifies that one memory state is associated with the lower page, three memory states are associated with the middle page, and three memory states are associated with the upper page. Because the middle and upper pages require three state reads per page, these pages often require more margin for errors. Thus, the storage device can utilize the code modified randomization distribution 1050 to focus the largest share of selected memory device states to the one state associated with the lower page (in this case, state D). This can provide more margin to the other pages as needed. The amount of margin provided can be adjusted via further modifying of the randomization seed. Embodiments of the storage device can generate various code modified randomization distributions 1050 based upon the coding scheme(s) utilized within the storage device.

Those skilled in the art will recognize that the modified memory device state distributions 1020 - 1050 can vary from the exact figures shown based on a variety of factors. In some embodiments, the modified randomization seed may be tuned or re-modified. Further, the distributions presented in FIG. 10 are presented to depict overall distributions after a large number (if not all) memory devices within the memory array are programmed. The presented distributions will accumulate to their representative values over time and may look differently when evaluating only a limited number of memory devices that have been programmed.

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A device comprising:
 a processor;
 a memory array comprising:
  a plurality of memory devices configured to be programmed into a plurality of states, each state corresponding to a unique value;
 a distribution logic configured to:
  receive host data for storage;
  parse the received host data into a plurality of values suitable for storage;
  determine a first portion of the plurality of values having a high read frequency;
  determine a first probability for storing the first portion of the plurality of values within a first portion of the plurality of memory devices;
  determine a second probability for storing a remaining portion of the plurality of values within a second portion of the plurality of memory devices;
  store each of the first portion of the plurality of values within one of a first plurality of states in the first portion of the plurality of memory devices; and
  store each of the second portion of the plurality of values within one of a second plurality of states in the second portion of the plurality of memory devices.

2. The device of claim 1, wherein the distribution logic is configured to:
- generate log data configured to facilitate a translation from the stored first portion and second portion of the plurality of values back to the host data.

3. The device of claim 2, wherein the distribution logic is configured to:
- prior to determine the first probability and the second probability, randomize the plurality of values based on an equal distribution probability.

4. The device of claim 3, wherein the log data comprises at least the plurality of values randomized based on the equal distribution probability and the first portion and second portion of the plurality of values.

5. The device of claim 1, wherein the high read frequency is determined based at least in part on a usage pattern of a host device.

6. The device of claim 1, wherein the determining the second probability is configured to select fewer states within a first group of the second plurality of states.

7. The device of claim 1, wherein the second plurality of states corresponds to groupings of an increasing range of voltage threshold range within the second portion of the plurality of memory devices.

8. The device of claim 7, wherein each grouping of the increasing voltage threshold range corresponds to a particular state.

9. The device of claim 8, wherein the second portion of the plurality of memory device states selected for grouping comprises memory device states that are affected by one or more negative effects.

10. The device of claim 9, wherein the grouping of the second portion of the plurality of memory states can be configured based on a desired reduction of one or more negative effects.

11. The device of claim 10, wherein the one or more negative effects include read disturb, program disturb, or data retention errors.

12. A method comprising:
- receiving host data for storage;
- parsing the received host data into a plurality of values suitable for storage;
- determining a first portion of the plurality of values having a high read frequency;
- determining a first probability for storing the first portion of the plurality of values within a first portion of the plurality of memory devices;
- determining a second probability for storing a remaining portion of the plurality of values within a second portion of the plurality of memory devices;
- storing each of the first portion of the plurality of values within one of a first plurality of states in the first portion of the plurality of memory devices; and
- storing each of the second portion of the plurality of values within one of a second plurality of states in the second portion of the plurality of memory devices.

13. The method of claim 12, further comprising generating log data configured to facilitate a translation from the stored first portion and second portion of the plurality of values back to the host data.

14. The method of claim 13, further comprising, prior to determining the first probability and the second probability, randomizing the plurality of values based on an equal distribution probability.

15. The method of claim 14, wherein the log data comprises at least the plurality of values randomized based on the equal distribution probability and the first portion and second portion of the plurality of values.

16. The method of claim 12, wherein the high read frequency is determined based at least in part on a usage pattern of a host device.

17. The method of claim 12, wherein the determining the second probability is configured to select fewer states within a first group of the second plurality of states.

18. The method of claim 1, wherein the second plurality of states corresponds to groupings of an increasing range of voltage threshold range within the second portion of the plurality of memory devices, and wherein each grouping of the increasing voltage threshold range corresponds to a particular state.

19. The method of claim 18, wherein the second portion of the plurality of memory device states selected for grouping comprises memory device states that are affected by one or more negative effects, and wherein the grouping of the second portion of the plurality of memory states can be configured based on a desired reduction of one or more negative effects including read disturb, program disturb, or data retention errors.

20. A non-transitory machine-readable medium having instructions stored therein, which when executed by a processor, direct the processor to perform operations comprising:
- receiving host data for storage;
- parsing the received host data into a plurality of values suitable for storage;
- determining a first portion of the plurality of values having a high read frequency;
- determining a first probability for storing the first portion of the plurality of values within a first portion of a plurality of memory devices;
- determining a second probability for storing a remaining portion of the plurality of values within a second portion of the plurality of memory devices;
- storing each of the first portion of the plurality of values within one of a first plurality of states in the first portion of the plurality of memory devices; and
- storing each of the second portion of the plurality of values within one of a second plurality of states in the second portion of the plurality of memory devices.

* * * * *